(12) United States Patent
Ochiai et al.

(10) Patent No.: US 6,410,397 B1
(45) Date of Patent: Jun. 25, 2002

(54) METHOD FOR MANUFACTURING A DIELECTRIC TRENCH CAPACITOR WITH A STACKED-LAYER STRUCTURE

(75) Inventors: Akihiko Ochiai; Masahiro Tanaka, both of Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/677,260

(22) Filed: Oct. 2, 2000

Related U.S. Application Data

(62) Division of application No. 09/244,201, filed on Feb. 4, 1999, now Pat. No. 6,215,646.

(30) Foreign Application Priority Data

Feb. 6, 1998 (JP) .......................................... P10-026092

(51) Int. Cl.[7] .......................... H01L 21/70; H01L 21/44
(52) U.S. Cl. ...................... 438/381; 438/239; 438/243
(58) Field of Search ................................ 438/381, 386, 438/239, 243

(56) References Cited

U.S. PATENT DOCUMENTS 5,691,219 A * 11/1997 Kawakubo et al. ......... 438/253

2001/0019885 A1 * 9/2001 Marsh ........................ 438/654

* cited by examiner

Primary Examiner—Richard Elms
Assistant Examiner—Beth Elise Owens
(74) Attorney, Agent, or Firm—Sonnenschein, Nath & Rosenthal

(57) ABSTRACT

A trench is formed by forming a photoresist film on a second interlevel insulator and performing isoprotonic etching using the photoresist film as a mask. A lower electrode layer made of platinum (Pt), a dielectric film made of a dielectric material and an upper electrode layer made of platinum (Pt) are formed in this order by, for example, a CVD method respectively. Further, the lower electrode layer and the upper electrode layer are selectively removed by a CMP method except for the trench with the second interlevel insulator as an end point detection layer, flattening the surface at the same time. Accordingly, a capacitor having a structure which has a flat surface comprised of both edges of the lower electrode layer and the dielectric film, and the upper electrode layer is formed in the trench of the second interlevel insulator respectively. Etching can be easily performed even when a stable material such as platinum is used as an electrode material, simplifying the manufacturing procedure since the lower electrode layer, the dielectric film and the upper electrode layer are processed collectively.

10 Claims, 13 Drawing Sheets

PRIOR ART

METHOD FOR MANUFACTURING A DIELECTRIC TRENCH CAPACITOR WITH A STACKED-LAYER STRUCTURE

This application is a divisional of application Ser. No. 09/244,201 filed Feb. 4, 1999, issued as U.S. Pat. No. 6,215,646. The present and foregoing applications claim priority to Japanese application No. P10-026092 filed Feb. 6, 1998. All of the foregoing applications are incorporated herein by reference to the extent permitted by law.

BACKGROUND OF THE INVENTION

1. Field of the Invention

The present invention relates to a dielectric capacitor with a structure preferable in a case where a material such as Pt (platinum) which is hard to have micro lithograph is used as electrode materials, and a method of manufacturing the same, and a dielectric memory using the same.

2. Description of the Related Art

Non-volatile ferroelectric memories using a ferroelectric thin film have been often developed with the recent advances in film making technology these days. The ferroelectric memories are non-volatile Ferroelectric Random Access Memories (FeRAM), which can perform high-speed rewriting by using high-speed polarization inverse of the ferroelectric thin film and the dielectric polarization thereof, and have a characteristic that written contents are not erased when the power is turned off, different from a volatile memory with which written information is erased when the power is turned off.

In conventional products of the ferroelectric memories with 64M level, Pt (platinum) is used as an electrode material to have a stable dielectric characteristic. It is because Pt is hard to be oxidized and so that an oxide layer with high electric resistance will not be easily formed in an interface between a dielectric film and the electrode. FIG. 1 shows a cross sectional structure of the conventional ferroelectric memory 100 in which Pt is used as an electrode material.

The ferroelectric memory 100 comprises a transistor 100A and a ferroelectric capacitor 100B. The transistor 100A comprises impurity regions 103A and 103B which are to be a source or a drain regions formed in an area surrounded by a filed insulator 102 on a surface of a substrate 101 made of such as silicon, and a gate electrode (word line) 105 formed on the substrate 101 between the impurity regions 103A and 103B through a gate insulator 104. The ferroelectric capacitor 100B has a structure with a lower electrode layer 108, a ferroelectric film 109 and an upper electrode layer 110 being stacked in this order. The lower electrode layer 108 and the upper electrode layer 10 are formed with Pt respectively. The lower electrode layer 108 is formed on a titanium stacking layer (TiN/Ti) 107 which is formed on a first interlevel insulator 106. Ti(titanium) film in the titanium stacking layer serves as a contact layer and TiN (titanium nitride) film in the titanium stacking layer serves as a diffusion preventing layer. The titanium stacking layer 107 is connected electrically to the impurity region 103A through a poly crystal silicon plug layer 111 buried in a contact hole which is provided in the interlevel insulator 106.

The titanium stacking layer 107, the lower electrode layer 108 and the ferroelectric film 109 are covered with stacking layers such as $TiO_2$ film 112 and CVD $SiO_2$ film 113 so as to prevent diffusion of oxygen. The upper electrode layer 110 is connected to the ferroelectric film 109 through the contact hole provided in the stacking layer. The ferroelectric capacitor 100B is covered with a second interlevel insulator 114. A contact hole 115 is provided in the second interlevel insulator 114 and the first interlevel insulator 106 and, through the contact hole 115, a bit line 116 is electrically connected to the impurity region 103B.

In this dielectric memory 100, when a voltage is applied to the gate electrode 105 of the transistor 100A, the transistor 100A is turned on and an electric current passes through between the impurity regions 103A and 103B. Thereafter, an electric current flows into the dielectric capacitor 100B through a contact plug layer 111 and a voltage is applied between the upper electrode layer 110 and the lower electrode layer 108. As a result, polarization occurs in the ferroelectric film 109. The voltage-polarization characteristic includes hysteresis which is utilized to store and read data of "1" or "0".

With the ferroelectric memory 100, there is a problem as follows when forming Pt as an electrode material of the ferroelectric capacitor 100B. That is, physical etching methods something close to ion milling etching have to be employed, since Pt is hard to be oxidized and stable as electrode materials. However, hard-to-remove deposits and a dirt made from a mixture of resist and platinum pile up when ion milling etching is applied.

FIGS. 2A and 2B are illustrated to show specific examples. FIG. 2A shows a state where a resist film 203 with an electrode pattern is formed on a platinum film 202 provided on a base layer 201, and the platinum film 202 is selectively removed by milling etching using the resist film 203 as a mask. A deposit 202a of platinum and possibly other of the materials are scattered during the etching and attach to sidewalls of the resist film 203. FIG. 2B shows a state where the resist film 203 is removed from the state described above, leaving the deposit 202a on the processed platinum layer 202. Such a state, where the deposit 202a remains on the processed platinum layer 202, is not favorable for micro lithography and is a main reason for hindering a high integration of the ferroelectric memory.

SUMMARY OF THE INVENTION

In view of the above-described problems, the present invention has been made. It is an object of this invention to provide a dielectric capacitor and a method of manufacturing the same, and a dielectric memory using the same, which can be easily processed even a stable material such as platinum is used as electrode materials, so that manufacturing process can be simplified.

The dielectric capacitor of the invention has an interlevel insulator with a trench being formed. In the trench of the interlevel insulator, a structure of stacking layer in which a first electrode layer, a dielectric film and a second electrode layer are stacked in this order, is buried.

Another dielectric capacitor of the current invention has the second interlevel insulator with a trench, and a stacking structure, in which the first electrode layer, the dielectric film and the second electrode layer are stacked in this order, being buried in the trench and has a third interlevel insulator with a contact hole contacting the second electrode layer being formed on the second interlevel insulator and with a sidewall made of insulating materials formed on a wall of the contact hole, and has a wiring layer being formed on the third interlevel insulator electrically connected to the second electrode layer through an area between sidewall films.

A manufacturing method of the dielectric capacitor according to the current invention includes steps of forming the second interlevel insulator with a surface being flattened on a substrate in which a transistor is formed covered with a first interlevel insulator, forming the trench in the second interlevel insulator contacting the transistor, flattening the surface of the trench according to the surface of the second interlevel insulator after stacking the first electrode layer, the dielectric film and the second electrode layer in the trench of the second interlevel insulator in this orderers To be more specific, the dielectric capacitor is manufactured after forming the trench in the second interlevel insulator, by stacking the first electrode layer, the dielectric film and the second electrode layer on the second interlevel insulator, further, etching the first electrode layer, the dielectric film and the second electrode layer by chemical-mechanical polishing method having the second interlevel insulator as an end point detection layer and flattening the surface of the trench in alignment with the surface of the second interlevel insulator.

The dielectric memory according to the current invention has the transistor formed covered with the first interlevel insulator in a substrate, the second interlevel insulator with the trench provided on the switching device, and the dielectric capacitor having a structure in which the first electrode layer which is electronically connected to the transistor, the dielectric film, and the second electrode layer are stacked in this order, is buried in the trench of the second interlevel insulator.

Another dielectric memory of the current invention has the transistor formed covered with the first interlevel insulator in a substrate, the second interlevel insulator with a trench provided on the transistor, the dielectric capacitor having a structure in which the first electrode layer which is electrically connected to the transistor, the dielectric film and the second electrode layer are stacked in this order, the second electrode layer being formed on the second interlevel insulator and with a sidewall made of insulating materials formed on a wall of the contact hole, and has a wiring layer being formed on the third interlevel insulator electrically connected to the second electrode layer through an area between sidewall films.

The dielectric capacitor and the dielectric memory of the current invention have a structure in which a stacking layer structure formed with the first electrode layer, the dielectric film and the second electrode layer are being buried so that accumulation capacitance is increased by stacking the first electrode layer and the dielectric film along the side and bottom of the trench.

With another dielectric capacitor and dielectric memory, connecting area can be made smaller than minimum line width since the second electrode layer and the wiring layer are electrically connected to each other through the area between the sidewall films formed in the as contact hole of the third interlevel insulator. For that, a short circuit of the upper electrode layer and the lower electrode layer can be prevented during a connecting procedure of the upper electrode layer and the wiring layer.

In a manufacturing method of the dielectric capacitor according to the current invention, the surface of the trench is flattened according to the surface of the second interlevel insulator after the first electrode layer, the dielectric film and the second electrode layer are stacked in this order in the trench of the second interlevel insulator. To be more specific, after forming the trench in the second interlevel insulator, stacking the first electrode layer, the dielectric film and the second electrode layer on the second interlevel insulator, further, collectively etching the first electrode layer, the dielectric film and the second electrode layer by chemical-mechanical polishing method having the second interlevel insulator as an end point detection layer and flattening the surface of the trench according to the surface of the second interlevel insulator.

DETAILED DESCRIPTION OF THE PREFERRED EMBODIMENTS

Preferred embodiments of the invention will now be described in detail with reference to the accompanying drawings.

[First Embodiment]

Figure 1:
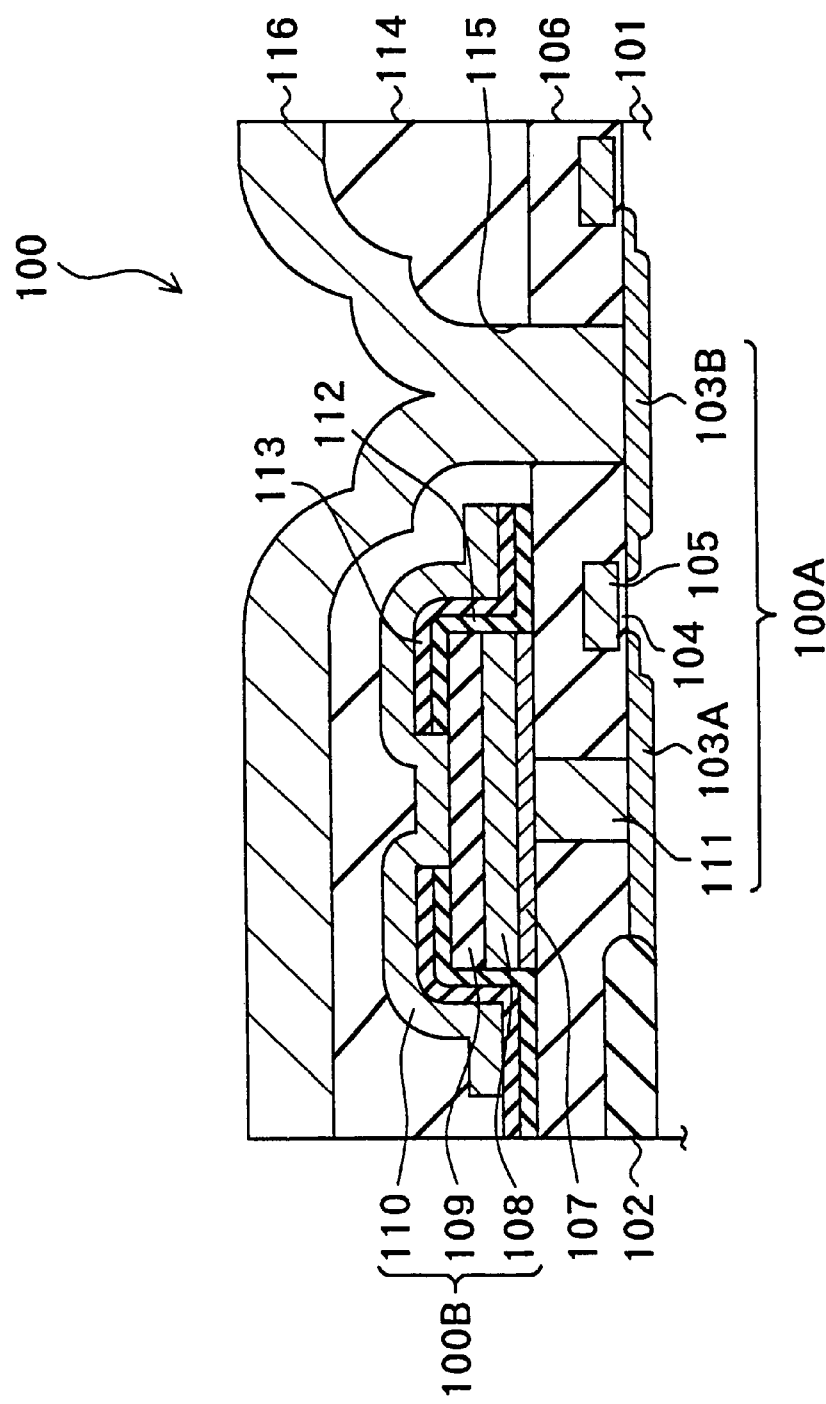
FIG. 1 is a cross sectional view of the conventional dielectric memory.
Figure 2A:
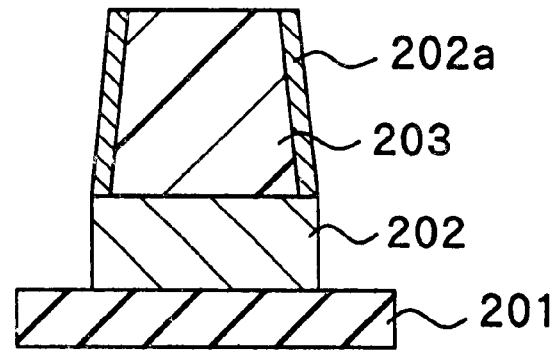
FIGS. 2A and 2B are cross sectional views for describing problems of the conventional dielectric memory.
Figure 2B:
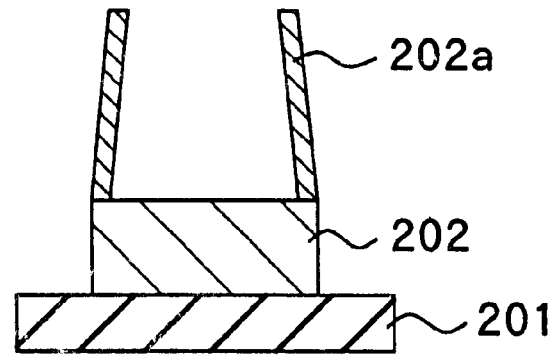
Figure 3:
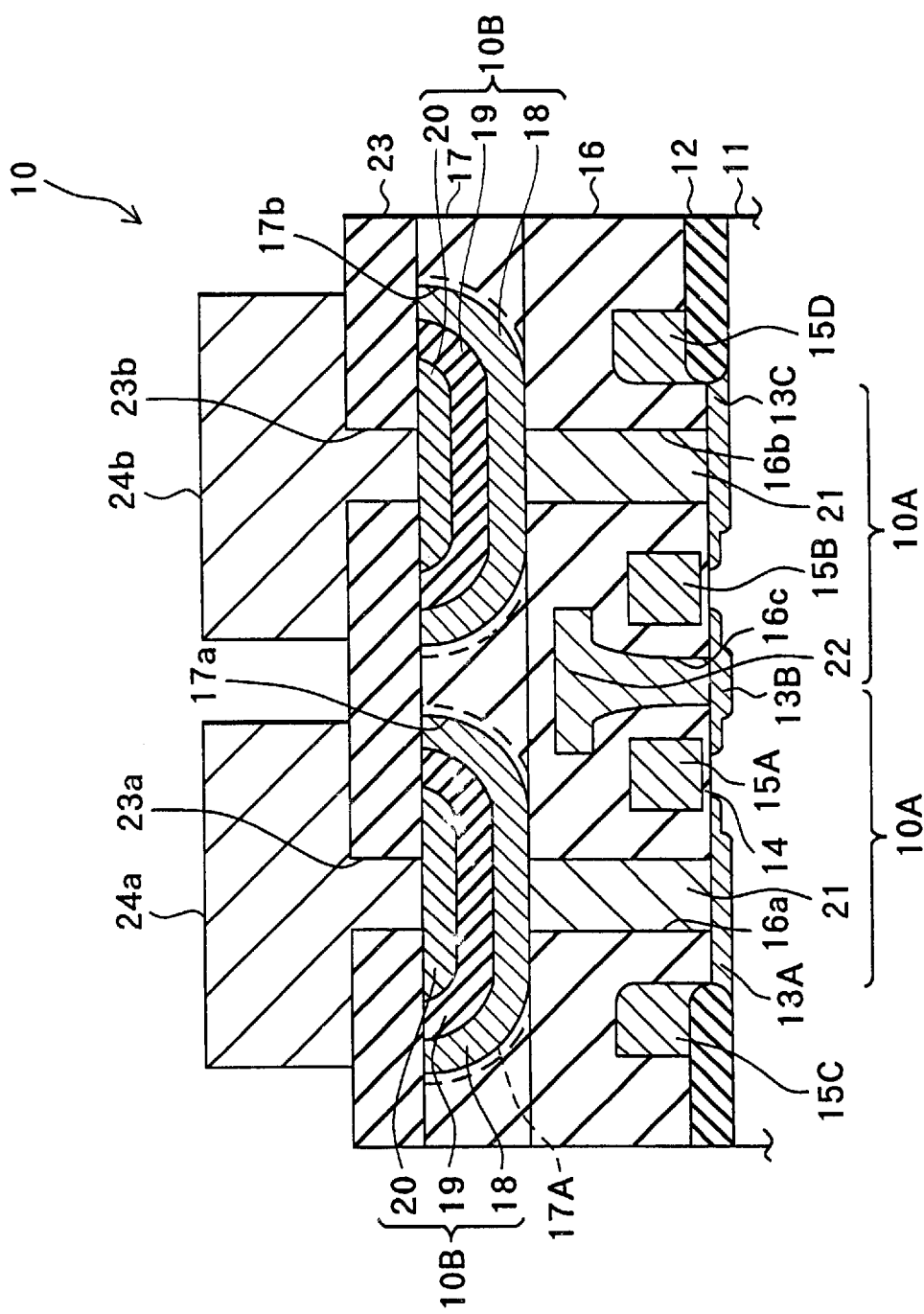
FIG. 3 is a cross sectional view showing the dielectric memory of the first embodiment of the invention.

FIG. 3 shows a cross sectional view of a dielectric memory 10 of the first embodiment of the current invention. The dielectric memory 10 comprises a plurality of (specifically two in here) the transistors 10A formed on a substrate 11 such as silicon and dielectric capacitors 10B each coupled with the transistor 10A.

Impurity regions 13A, 13B and 13C with LDD (Lightly Doped Drain) structure, which are to be a source or drain, are formed in an area surrounded by a field insulator 12 on a surface of a substrate 11. Word lines (serving also as electrode gates) 15A and 15B are formed respectively through a gate insulator 14 on the substrate 11 between the impurity regions from 13A to 13C. One of the transistor 10A comprises the impurity regions 13A, 13B and the word line 15A, while the other transistor 10A comprises 13B, 13C and the word line 15B. Further, other word lines 15C and 15D are also formed on a field insulator 12. Each line width of the word lines A, B, C and D are 0.25 µm, for example.

The transistor 10A is covered with a first interlevel insulator 16 having a film thickness of 0.75 µm made up of, for example, BPSG (Boro-Phospho-Silicate Glass), PSG (Phospho-Silicate Glass), NSG (Non-Silicate Glass) and SOG (Spin on Glass). First interlevel insulator 16 is also covered with a second interlevel insulator 17 having, for example, a thickness of 0.4 µm made up with PSG, for example. In the embodiment, dielectric capacitors 10B and 10B having stacking structures are buried respectively in the second interlevel insulator 17 corresponding to each transistor 10A. That is, two trenches 17a and 17b are formed in the second interlevel insulator 17, and the capacitor 10B having a structure in which a lower electrode layer 18, a dielectric film 19 and an upper electrode layer 20 are stacked in this order in each of the trenches 17a and 17b. The lower electrode layer 18 corresponds to the first electrode layer of the current invention, the dielectric film 19 to the dielectric film and the upper electrode layer 20 to the second electrode layer respectively. The trenches 17a and 17b have an arc-shaped curvature along the bottom and side areas, and both edges of the lower electrode layer 18 and the dielectric film 19 have curved-shapes respectively according to the curvature of the trenches 17a and 17b.

Mutual-diffusion-preventing area 17A using $N_2$ is formed by applying $N_2$(Nitrogen) onto each surface of the trenches 17a and 17b. Mutual diffusion between the second interlevel insulator 17 and the lower electrode layer 18 is interrupted by the mutual-diffusion-preventing area 17A, and short circuit of both lower electrode layers 18 formed adjacent to each other can be prevented by means of the mutual-diffusion-preventing area 17A.

The lower electrode layer 18 and the upper electrode layer 20 in the embodiment are formed with Pt (Platinum) respectively. However, other metal materials such as, Ir (Iridium), Ru (Ruthenium), Rh (Rhodium), Pd (Palladium) can be used.

The dielectric film 19 is formed with ferroelectrric materials or materials with high dielectric constant (that is, high dielectric characteristic), (called high dielectric materials in the followings). The dielectric capacitor 10B becomes a ferroelectric capacitor when ferroelectric materials is used, and becomes a high dielectric capacitor when high dielectric material is used. The ferroelectric materials include, for example, SBT (general formula is $Bi_2SrTa_2O_9$), SBTN (general formula is $Bi_2SRTa_{2-x}Nb_xO_9$), PZT (general formula is Pb (Zr, Ti) $O_3$), and PLZT (general formula is (Pb,La) (Zr, Ti) $O_3$), the high dielectric materials are such as tantalum oxide (V) (general formula is $Ta_2O_5$), BST (general formula is (Ba, Sr)$TiO_3$), and STO (general formula is $SrTiO_3$) respectively.

Both edges of the lower electrode layer 18 and the dielectric film 19 are on the same surface with the upper electrode layer 20 respectively making a flat surface along with the second interlevel insulator 17.

Contact holes 16a and 16b are provided in a first interlevel insulator 16, contact plug layers 21 made of conductive poly crystal silicon are buried in the contact holes 16a and 16b respectively. Each lower electrode layer 18 of the dielectric capacitor 10B and 10B is electrically connected to the impurity regions 13A and 13C through the contact plug layer 21. The impurity region 13B is electrically connected to bit line 22 made with W(tungsten), for example, through a contact hole 16c provided in the first interlevel insulator 16.

Further, third interlevel insulator 23 formed with, for example, PSG, BPSG, NSG, and SOG are provided on the second interlevel insulator 17. Wiring layers 24a and 24b made of, for example, Al (Aluminum) are electrically connected to the upper electrode layer 20 through contact holes 23a and 23b formed in the third interlevel insulator. 23. A plate line is composed of the wiring layer 24a and 24b.

When a specific voltage is applied to a gate electrode (such as word line 15A) of the transistor 10A, the transistor 10A is turned on and current flows between the impurity regions 13A and 13B in the dielectric memory 10. Accordingly, current flows in the dielectric capacitor through the contact plug layer 21 and a voltage is applied between the upper electrode layer 20 and the lower electrode layer 18. As a result, polarization occurs in the ferroelectric film 19. The voltage-polarization characteristic includes hysteresis which is utilized to store and read data of "1" or "0".

The dielectric memory 10 has a structure in which the dielectric capacitors 10B are buried in the trenches 17a and 17b of the second interlevel insulator 17, and the corner of the bottom area of the lower electrode layer 18 and the dielectric film 19 take a curved-shape accordingly with the shape of the trenches 17a and 17b. As a result, a characteristic fluctuation becomes small and, comparing with the conventional dielectric capacitor, contact area of each layer becomes larger and accumulation capacitance is increased.

A manufacturing method of the dielectric memory 10 will now be described with a reference to the FIGS. 4, 5 and FIG. 3.

Figure 4A:
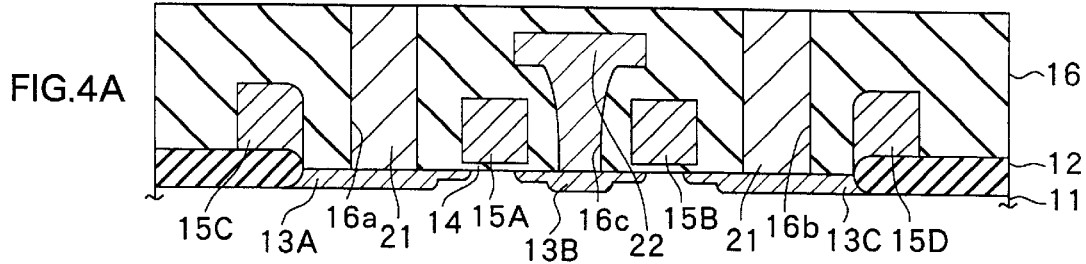
FIGS. 4A, 4B and 4C are cross sectional views illustrating manufacturing steps respectively of the dielectric memory shown in FIGS. 4A, 4B and 4C.

As shown in FIG. 4A, the first interlevel insulator 16 made of, for example, BPSG is formed by CVD (Chemical Vapor Deposition) method, for example, after forming the filed insulator 12, the impurity regions 13A, 13B and 13C which are to be the source of the drain, the word lines 15A, 15B, 15C and 15D, and the bit line 22 on a p-type silicon substrate 11 through a process consistent with officially-known DRAM (Dynamic Random Access Memory) transistor process. Further, the contact holes 16a and 16b are formed in the first interlevel insulator and poly crystal silicon is buried in the contact holes 16a and 16b respectively using CVD method, for example. At the same time, the contact plug layer 21 is formed by doping P (Phosophorus), for example, in the ply crystal silicon. After the above-mentioned procedure is completed, the second interlevel insulator 17 made of BPSG is formed on the first interlevel insulator 16 using, for example, a CVD method by flattening the surface of the first interlevel insulator 16 using, for example, a CMP method.

Figure 4B:
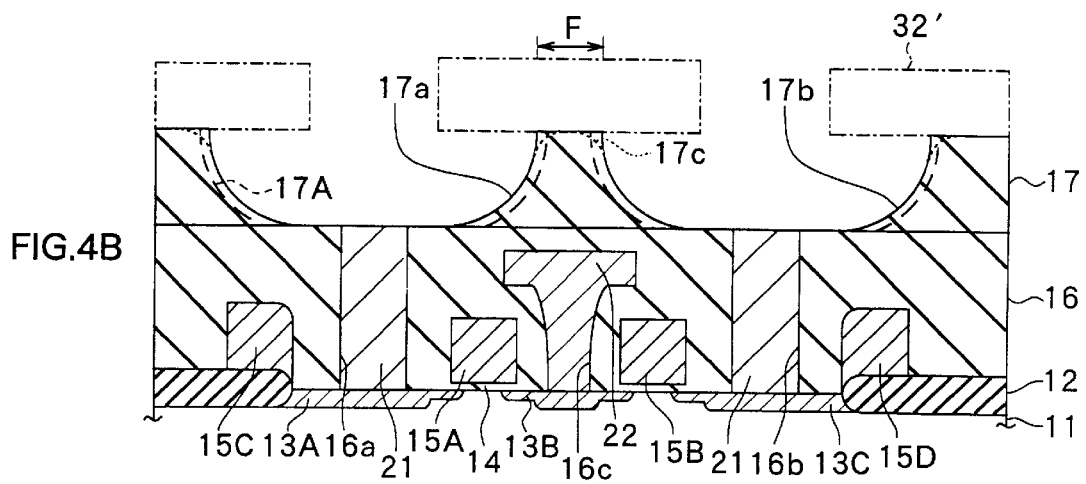

As shown in FIG. 4B, a photoresist film 32' with a capacitor pattern is formed on the second interlevel insulator 17, and the trenches 17a and 17b extended to the contact plug layer 21 are formed by applying isotropic etching using the photoresist film 32' as a mask. Wet etching using HF (hydrofluoric acid) as etching liquid, for example, is applied for sufficient length of time (30 minutes, for example) until the space between he neighboring trenches 17a and 17b becomes the minimum line width (F) (0.25 µm, for example) or less.

In a case where coating characteristics of the lower electrode layer 18, the dielectric film 19 and the upper electrode layer 20 are not sufficient, conducting re-flow is preferable in order to smoothen the edges of the openings of the trenches 17a and 17b as shown in FIG. 4B with a broken line 17c. To be more specific, when the second interlevel insulator is formed with BPSG, heat treatment at, for example, 850° C. is conducted for 10 minutes. Further, the mutual diffusion preventing area 17A is formed on the surface of the second interlevel insulator 17, in which the trenches 17a and 17b are being formed, by ion implantation method or implanting nitrogen by RTA (Rapid Thermal Annealing) using $NH_3$ (Ammonia) or $N_2O$ (nitrous oxide).

Figure 4C:
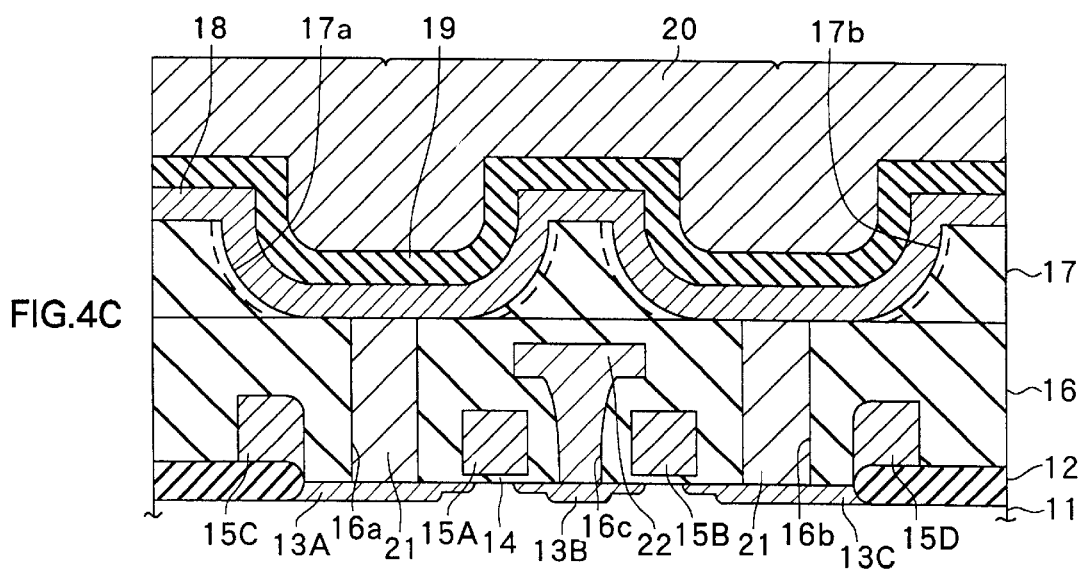

Further, as shown in FIG. 4C the lower electrode layer 18 having 100 nm in film thickness made of, for example, platinum (Pt), the dielectric film 19 having 100 nm in film thickness made of ferroelectric materials such as SBT, and the upper electrode layer 20 having, for example, 0.5 μm in film thickness made of platinum (Pt) are formed by, for example, sputtering method or CVD method respectively. Further, if, at this time, a coefficient of thermal expansion between the second interlevel insulator 17 and the lower electrode layer 18 is extremely different making it easy to come off, it is preferable to prevent the lower electrode layer 18 to come off by providing a buffer layer made of Ta (tantalum) or its oxide.

Figure 5A:
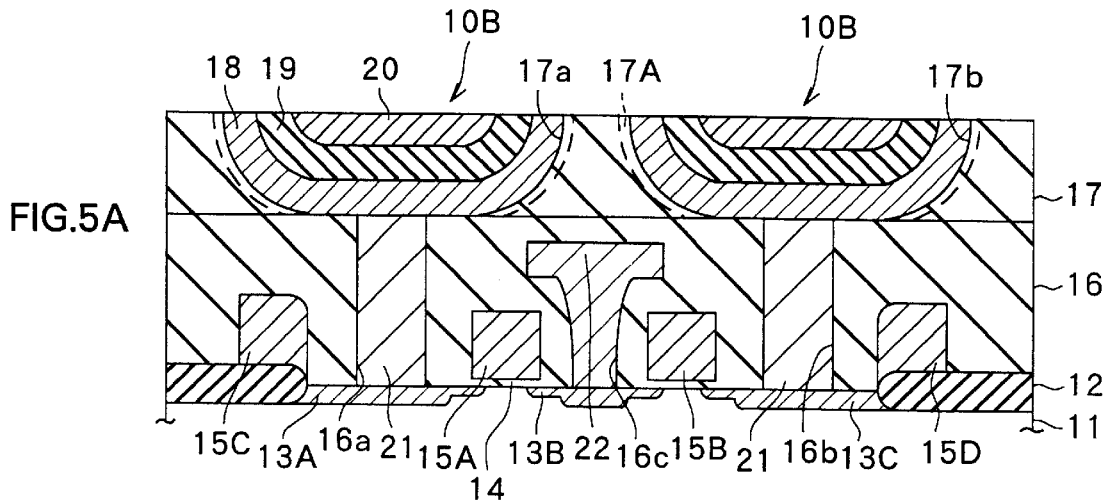
FIGS. 5 and 5B are cross sectional views illustrating manufacturing steps respectively of the dielectric memory continued from FIG. 4C.

As shown in FIG. 5A, the lower electrode layer 18, the dielectric film layer 19 and the upper electrode layer 20 except for the area of the trenches 17a and 17b are selectively removed and with the second interlevel insulator 17 as an end point detection layer, at the same time, the surface is flattened using CMP method. As a result, the dielectric capacitor 10B with a flattened surface which consists of each edge of both the lower electrode layer 18 and the dielectric film 19 along with the surface of the upper electrode layer 20, is formed in the trenches 17a and 17b of the second interlevel insulator 17 respectively.

Figure 5B:
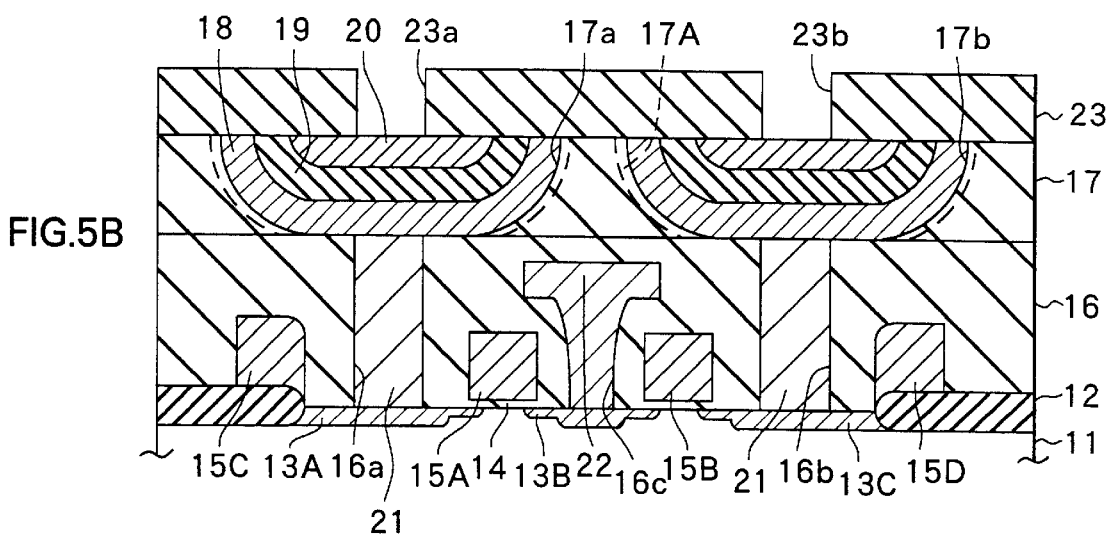

Further, as shown in FIG. 5B, the third interlevel insulator 23 made of PSG is formed by, for example, CVD method on the dielectric capacitor 10B and the second interlevel insulator 17. The wiring 24a and 24b are formed by evaporating and patterning, for example, Al (Aluminum) is formed on the third interlevel insulator 23 after forming the contact holes 23a and 23b in the third interlevel insulator 23 by photolithography. W (tungsten), for example, may be applied into the contact holes 23a and 23b when necessary. The dielectric memory 10 shown in FIG. 3 is completed by following through a standard metal wiring procedure after completing the above-mentioned procedure.

In the embodiment as described above, the dielectric capacitors 10B and 10B are easily formed even if a material which is hard to have micro lithography such as Pt is used as an electrode material, since the second interlevel insulator 17 is formed on the transistors 10A and 10A providing the trenches 17a and 17b, the lower electrode layer 18, the dielectric film 19 and the upper electrode layer 20 are stacked in this order on the second interlevel insulator 17 including the trenches 17a and 17b. The procedure is simplified since conventional micro lithography procedure by ion milling method is unnecessary.

Further, in the embodiment, mutual diffusion between the second interlevel insulator 17 and the lower electrode layer 18 can be prevented since the mutual-diffusion-preventing area 17A made of $N_2$ is formed in a neighboring area of the lower electrode 18 of the second interlevel insulator 17. Accordingly, short circuit of the lower electrode layers 18 formed adjacent to each other can be prevented. Further, exfoliation of the lower electrode layer 18 can be prevented by providing the buffer layer made of Ta (tantalum) or its oxide, for example, between the second interlevel insulator 17 and the lower electrode layer 18.

[Second Embodiment]

Figure 6:
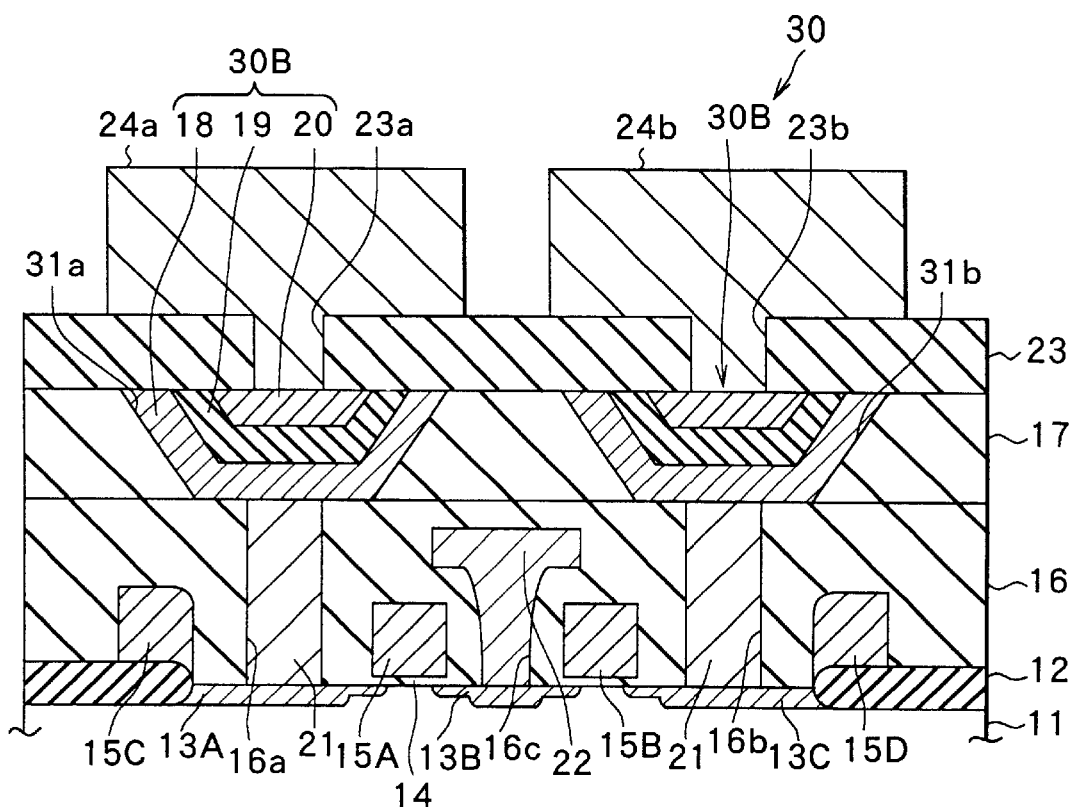
FIG. 6 is a cross sectional views of the dielectirc memory of the second embodiment of the invention.

FIG. 6 shows a structure of a dielectric memory 30 in the second embodiment of the current invention. A dielectric capacitor 30B of the dielectric memory 30 takes a cross-section shape which is different from the first embodiment. Other structures are identical to the first embodiment. A prominent feature of the second embodiment will now be described and others identical to the first embodiment will be omitted.

In the second embodiment, trenches 31a and 31b formed in the second interlevel insulator 17 have areas with a taper angle in the side respectively and cross sections take a shape of trapezoid. Accordingly, both edges of the dielectric film 19 and the upper electrode layer 20 have areas with taper angle corresponding to the trenches 31a and 31b. Thus, coating can be better applied to the both edges of each layer and a characteristic of the dielectric capacitor is stabilized by providing the area with taper angle in the trenches 31a and 31b.

Figure 7:
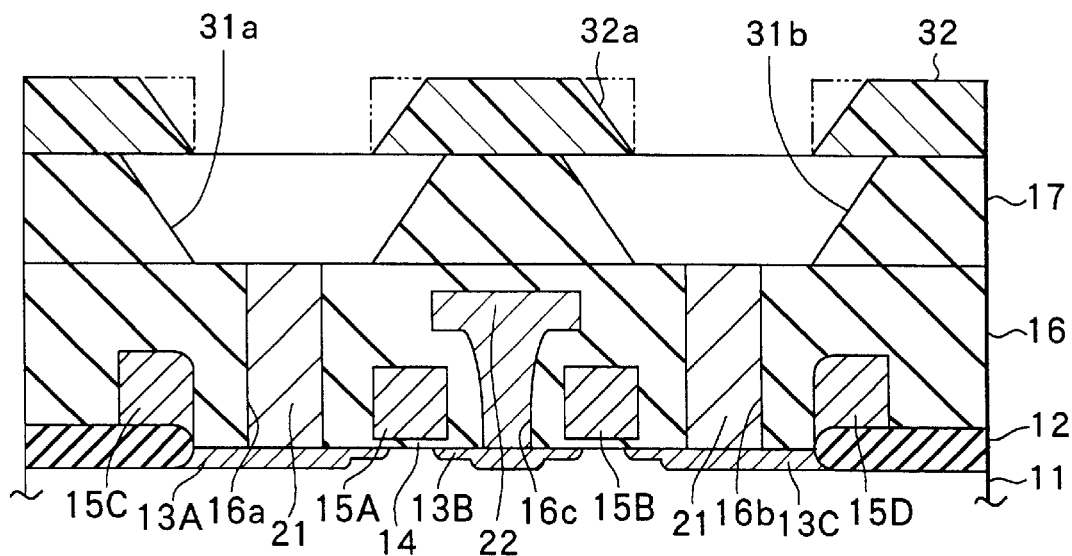
FIG. 7 is a cross sectional view for describing the manufacturing steps of the dielectric memory shown in FIG. 6.

The trenches 31a and 31b can be formed by utilizing reflux of photoresist film. That is, as shown in FIG. 7, for example, after forming the second interlevel insulator 17, the photoresist film 32 having a pattern of the trench is formed on the second interlevel insulator 17, and a photoresist film 32 having an area with taper angle 32a is formed in an opening by heating at, for example 250° C. In this state, when anisotropic etching is applied provided that selection ratio with the photoresist is small, the trenches 31a and 31b having areas with taper angle are formed, for example, by reflux of the photoresist. After following the above-mentioned procedure, like the first embodiment, the lower electrode layer 18, the dielectric film 19 and the upper electrode layer 20 are stacked in this order, and then the surface is flattened by collectively removing an unnecessary area using CMP method.

Third Ebodiment

Figure 8:
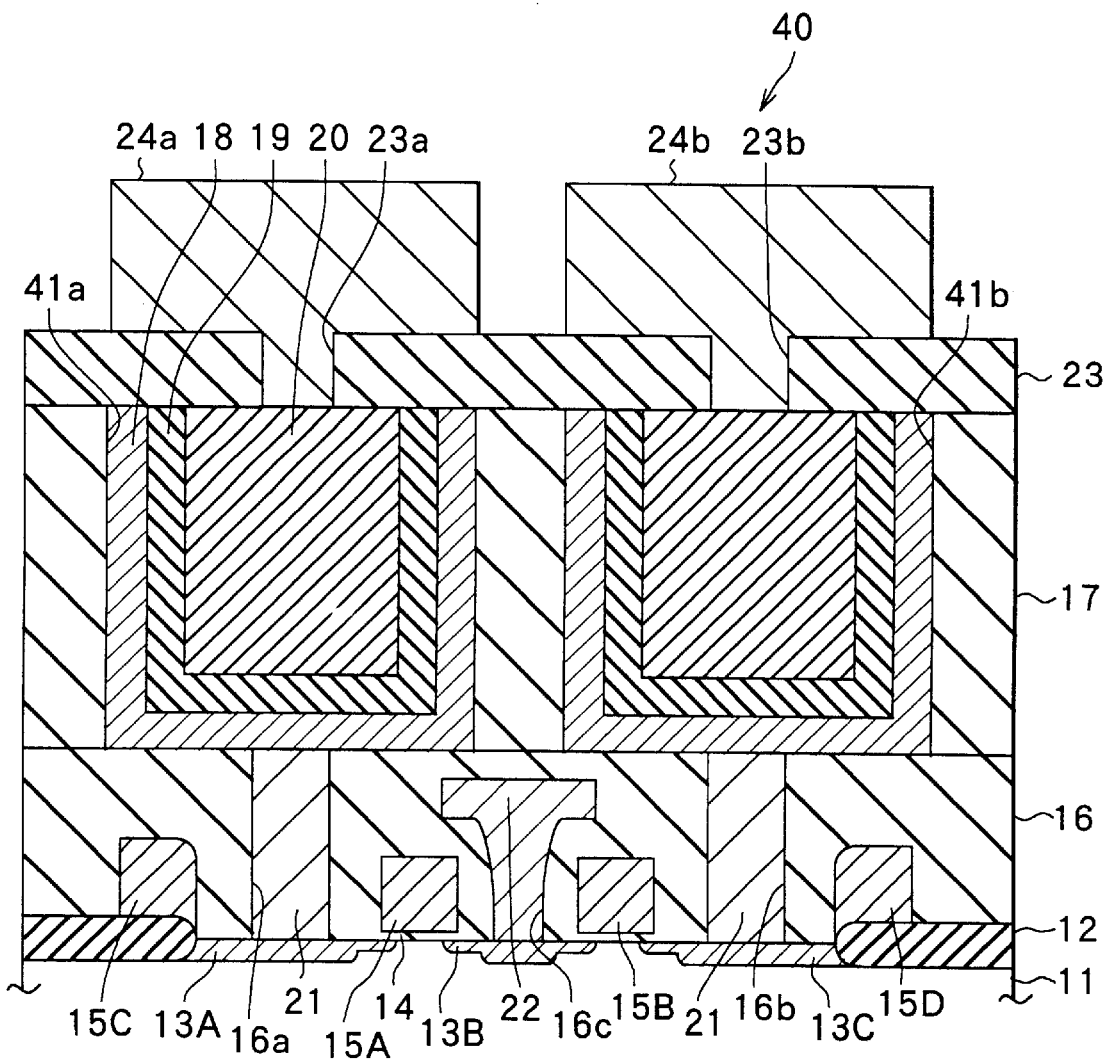
FIG. 8 is a cross sectional view of the dielectric memory of the third embodiment of the invention.

FIG. 8 shows a structure of a dielectric memory 40 in the third embodiment. The dielectric memory 40 is effective when a sufficient amount of signal cannot be obtained with the first and second embodiment, since the dielectric memory 40 has a structure where the second interlevel insulator 17 is thickened and trenches 41a and 41b are deepened compared to the foregoing embodiments and, at the same time, a cross section takes a shape of rectangle or square and designed to increase the area of capacitor which results in increasing capacitance to a great extent. Other structures are identical to the first embodiment.

In general, when a capacitor takes a shape rectangle of an electric field is concentrated in the corner of each layer so that a characteristic fluctuation becomes large. However, according to the embodiment, when the area of the capacitor toward a direction of height becomes large, the characteristic fluctuation of the corner becomes relatively small. For this, the corner does not need to be curved nor an area with taper angle has to be provided in the trench unlike the first and second embodiment. Accordingly, in the embodiment, the edges of the opening is smoothened by re-flowing after applying anisoptropic etching to the second interlevel insulator 17 by RIE and form the trenches 41a and 41b which have a rectangular-shaped cross section are formed. Further, the dielectric capacitor can be manufactured by simply stacking the lower electrode layer 18, the dielectric layer 19 and the upper electrode layer 20 in this order, then, the unnecessary area is removed collectively by CMP method like the first embodiment.

In the second and third embodiment, the dielectric capacitor can be manufactured easily and, at the same time, procedure can be simplified. These effects are identical to the first embodiment.

[Fourth Embodiment]

Figure 9:
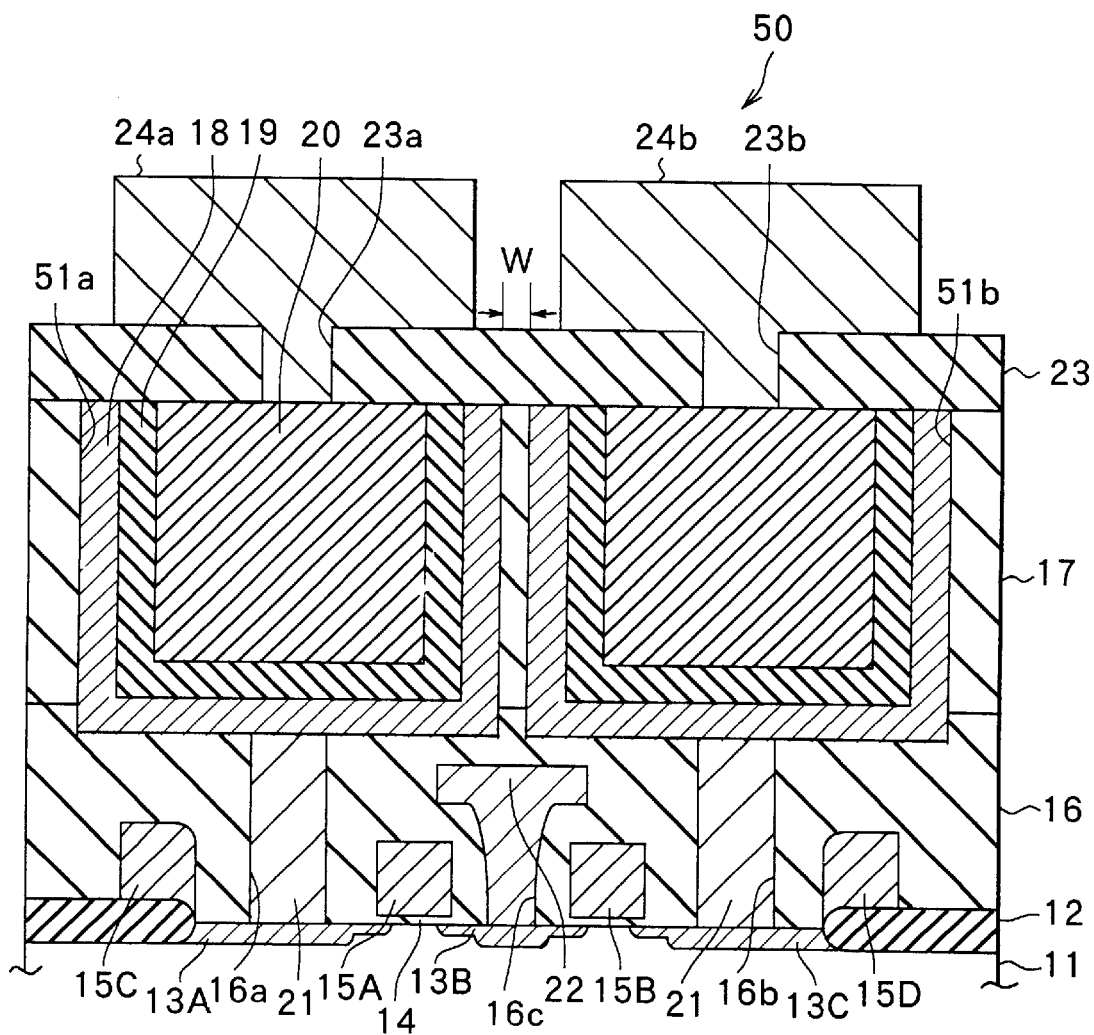
FIG. 9 is a cross sectional view of the dielectric memory of the fourth embodiment of the invention.

FIG. 9 shows a structure of a dielectric memory 50 in the fourth embodiment. The dielectric memory 50 is designed to have the capacitance of trenches 51a and 51b increased and the surface area of the capacitor increased by applying isotropic etching under a condition in which a resist mask is removed or resist mask is remained after forming the trenches 51a and 51b using the second interlevel insulator 17 as a mask like the third embodiment. In the embodiment, the etching rate of the second interlevel insulator 17 and the etching rate of the contact plug layer 21 made of poly crystal silicon are the same when etching. A mixed gas of $CF_4$ and $O_2$ is used as an etching gas, for example.

In the embodiment, a distance W between the trenches 51a and 51b of the capacitors formed adjacent to each other can be set smaller than the minimum line width F using the above-mentioned method.

Figure 10A:
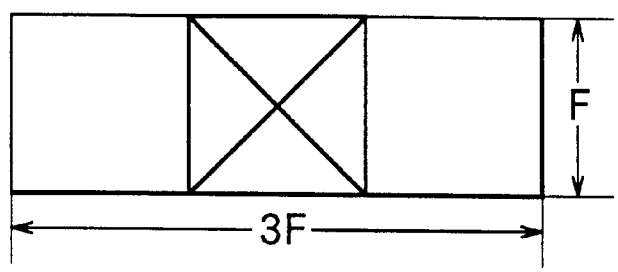
FIGS. 10A and 10B are top views for describing short circuit of the upper electrode layer and the lower electrode layer in the dielectric capacitor.

The structure of a cell of the dielectric memory is similar to the conventional DRAM and, therefore, is generally developed in a similar manner. For this, the ultimate cell area is referred as 4F×2F (F; minimum line width) and a plane area of the capacitor is referred as 3F×F as shown in FIG. 10A. On the other hand, the structure of the capacitor which is quite different from DRAM is that the upper electrode of each capacitor is electrically connected to the wiring layer (plate line) through the contact holes in the dielectric memory. The contact holes are usually designed with the minimum line width so that they are to be stacked out from the upper electrode with lithography being taken into consideration.

Figure 10B:
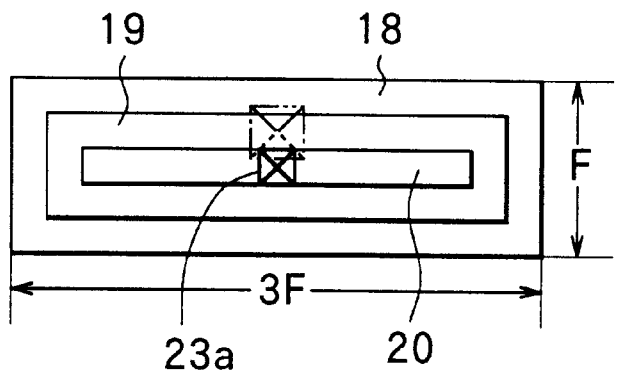

Especially with the above-mentioned dielectric memory 10, 30, 40, and 50 as shown in FIG. 10B, short circuit of the lower electrode layer 18 and the upper electrode layer 20 may occur when a location of the contact hole 23a is shifted as shown with a double-dotted line in the drawing since the lower electrode layer 18, the upper electrode layer 20 and the dielectric film 19 are on the surface of the second interlevel insulator 17. The dielectric memory having a structure of preventing short circuit between the electrodes as mentioned above will now be described as the fifth embodiment of the current invention.

[Fifth Embodiment]

Figure 11:
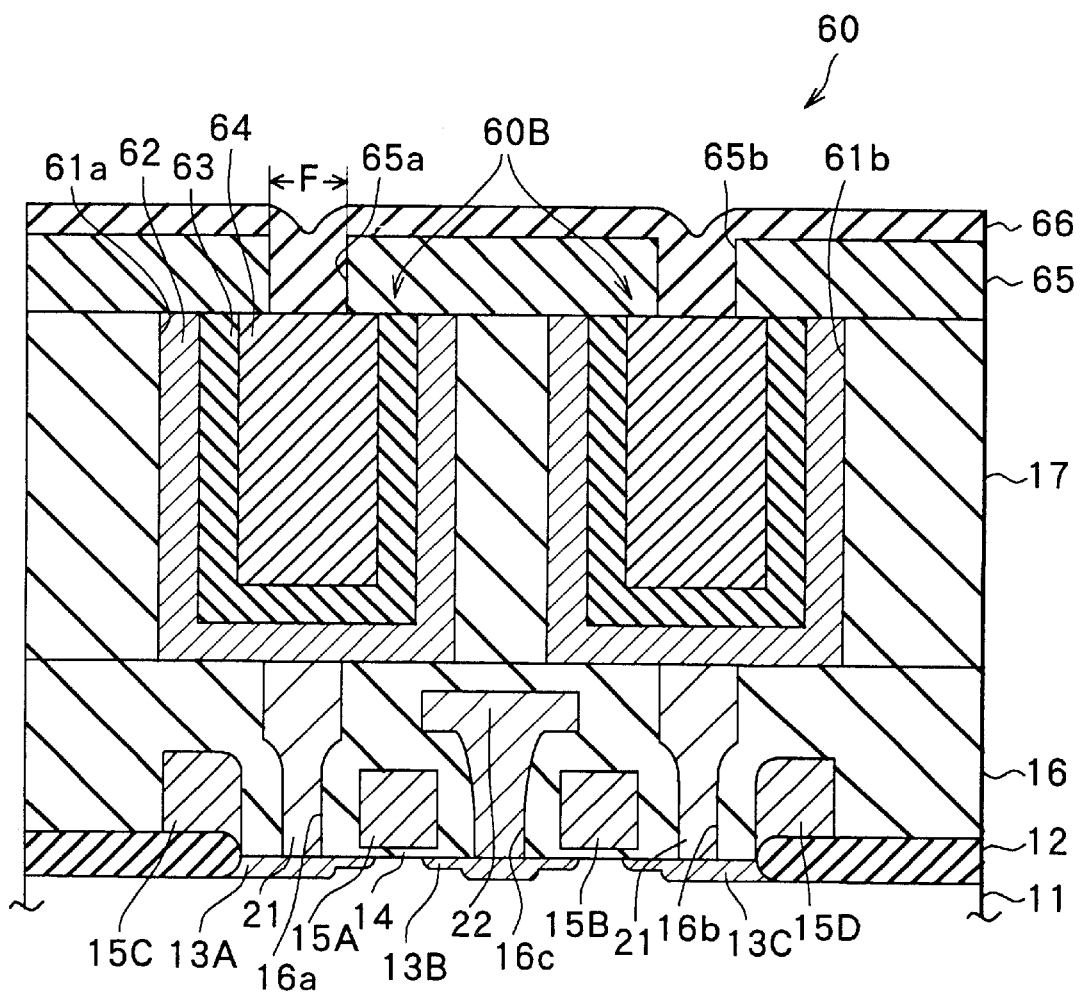
FIG. 11 is a cross sectional view of the dielectric memory of the fifth embodiment of the invention.

FIG. 11 and FIG. 12 show a dielectric memory 60 in the fifth embodiment. Description of the procedure until FIG. 5B is omitted since the structure is substantially identical to the foregoing embodiment except for the shape of the capacitor, and the procedure thereafter will be described.

Figures 12A, 12B:
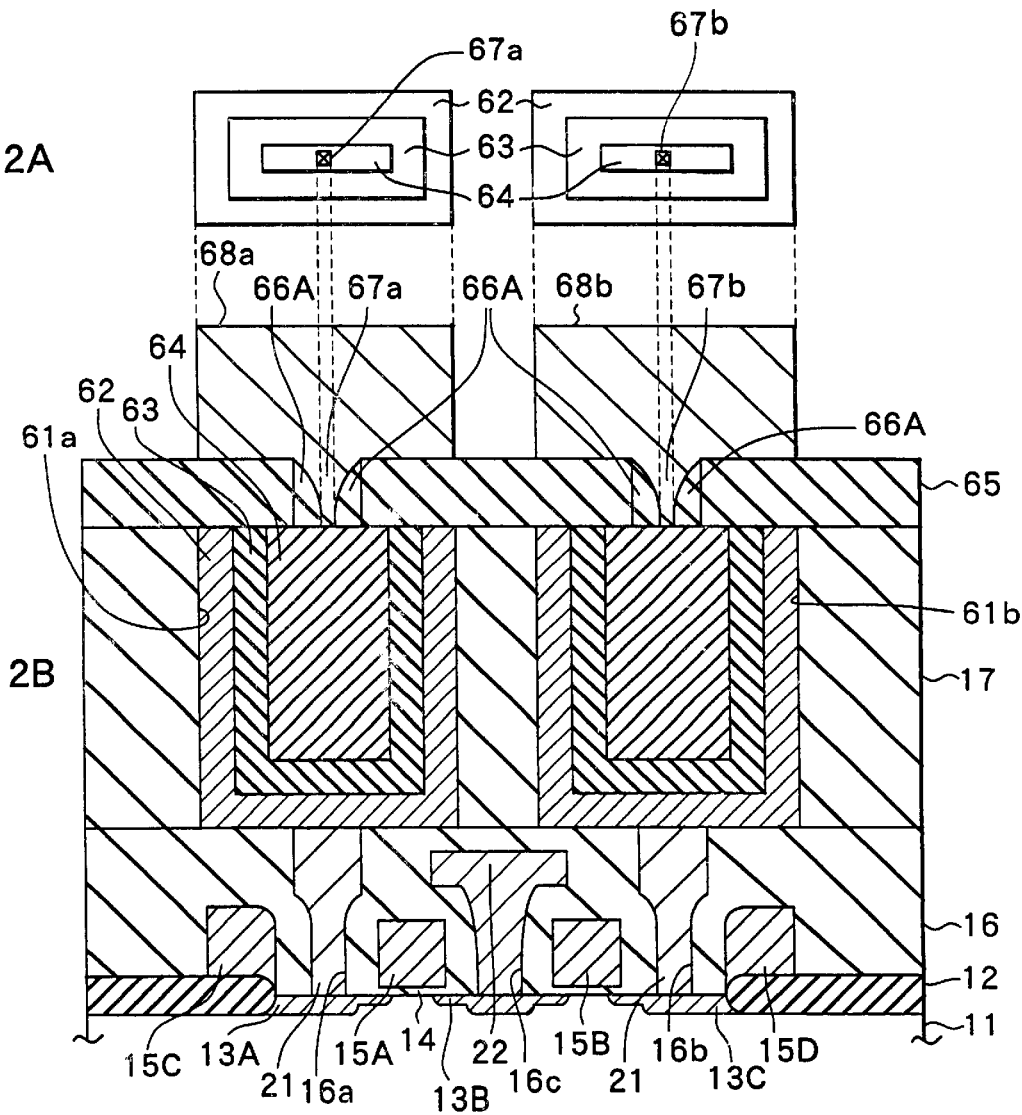
FIGS. 12A and 12B are cross sectional views for describing the manufacturing steps of the dielectric memory shown in FIG. 11.

As shown in FIG. 11, like the embodiment mentioned above third interlevel insulator 65 made of, for example, NSG is formed in the dielectric capacitor and on the second interlevel insulator 17 after forming a lower electrode layer 62, a dielectric film 63 and an upper electrode layer 64 respectively in trenches 61a and 61b of the second interlevel insulator 17. A fourth insulator 66 made of $SiO_2$ (silicon oxide) is formed on the third interlevel insulator 65 by, for example, CVD method after forming contact holes 65a and 65b having the minimum line width F in the third interlevel insulator 65. Further, sidewall films 66A and 66B are formed in the inner walls of the contact holes 65a and 65b by applying RIE as shown in FIGS. 12A and 12B. Accordingly, contact holes 67a and 67b having a width practically smaller than the minimum line width F can be formed.

After following the procedure mentioned above, wiring layers 68a and 68b (plate line) are formed on the third interlevel insulator 65 by evaporating and patterning Al (aluminum), for example, like the first embodiment. The dielectric memory 60 of the embodiment can be completed after following through the standard metal wiring procedure.

In the embodiment, the contact holes 67a and 67b having the width substantially smaller in than the minimum line width F can be formed since the sidewall film 66A is formed in the electrically connected area of the wiring layer 68a, 68b and the upper electrode layer 64 on the dielectric capacitor 60B. Accordingly, short circuit of the lower electrode layer 62 and the upper electrode layer 64 can be prevented during the connecting procedure of the upper electrode layer 64 and the wiring layers 68a and 68b.

[Sixth Embodiment]

In the embodiment, a manufacturing method of a case in which an extra convex area (flash) (shown in FIG. 13B) is being formed by plastic distortion occurred mainly in the forming materials of the bottom electrode layer 18' and the upper electrode layer 20 when removing the unnecessary area by CMP method, after stacking the lower electrode layer 18', the dielectric film 19 and the upper electrode layer 20 in the foregoing embodiment will be described. Here, it will be described by referring to the dielectric memory 10 of the first embodiment as an example. In the followings, a description of points different from the first embodiment will be made, however, description of identical points will be omitted with like numerals of the first embodiment being assigned.

Figure 13A:
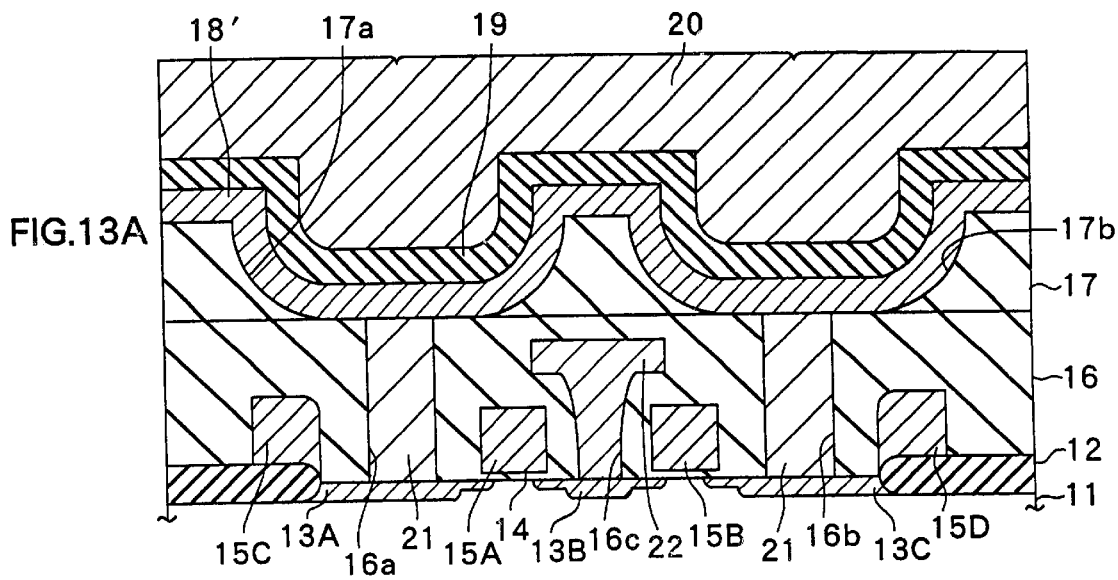
FIGS. 13A and 13B are cross sectional views for describing the manufacturing steps of the dielectric memory according to the sixth embodiment of the invention.
Figure 13B:
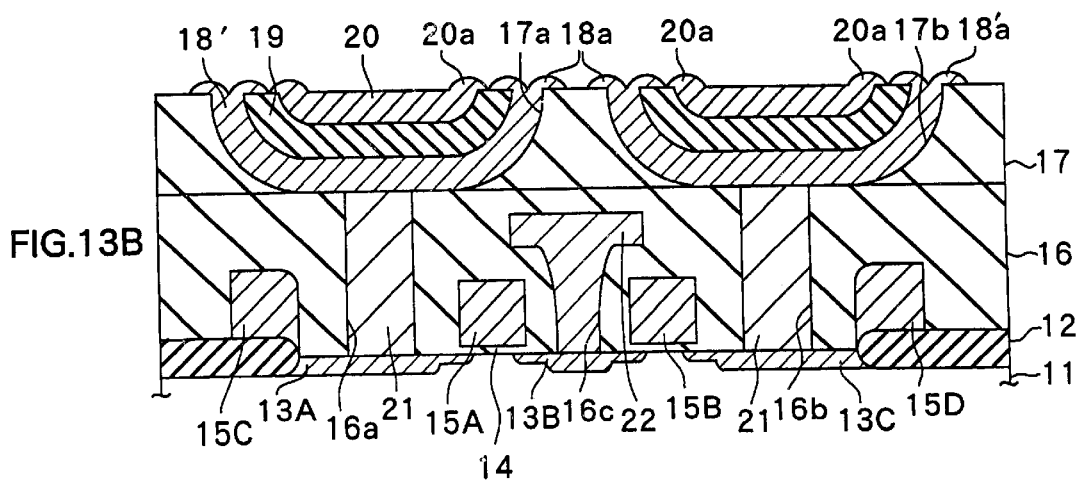

FIGS. 13A and 13B show a main manufacturing procedure of the dielectric memory 10 according to the embodiment. In the embodiment, first, trenches 17a and 17b of 400 nm in depth and 1500 nm in width are formed, for example, through the same procedure as the first embodiment shown in FIG. 4B.

Next, shown in FIG. 13B, unnecessary areas of the lower electrode layer 18', the dielectric film 19 and the upper electrode layer 20 are collectively removed with the second interlevel insulator 17 as an end point detection layer by, for example, CMP method. Here, a flash of Pt is stacked out on the dielectric film 19 side since the Pt forming the lower electrode layer 18' and the upper electrode layer 20 is more ductile than the SBT forming the dielectric film 19. That is, a convex area 18'a made of Pt of the lower electrode layer 18' and a convex area 20a made of Pt of the upper electrode layer 20 forms on the surfaces of the dielectric film 19 and the second interlevel insulator 17. A short circuit will occur between the lower electrode layer 18' and the upper electrode layer 20, and in between the lower electrode layers 18' formed adjacent depending on an yielding condition of the convex areas 18a and 20a.

Next, as shown in FIG. 13B, unnecessary areas of the lower electrode layer 18', the dielectric film 19 and the upper electrode layer 20 are collectively removed with the interlevel insulator 17 as an end point detection layer by, for example, CMP method. Here, a flash of Pt is stack out to the dielectric film 19 side since Pt forming the lower electrode layer 18 and the upper electrode layer 20 is more ductile than SBT forming the dielectric film 19. That is, a convex area 18'a made of Pt of the lower electrode layer 18' and a convex area 20a made of Pt of the upper electrode layer 20 yield on the surfaces of the dielectric film 19 and the interlevel insulator 17. A short circuit will occur between the lower electrode layer 18' and the upper electrode layer 20, and in between the lower electrode layers 18' formed adjacent depending on an yielding condition of the convex areas 18'a and 20a.

In the embodiment, next, the convex area 18'a and 20a are removed by RIE under a condition of an etching pressure (gas pressure) being 5 mTorr and a plasma generating electricity being 90W while supplying a mixture of Ar (argon) gas and $Cl_2$ (chlorine) gas to the whole surface of the substrate 11 with an amount of flowing ratio being $Ar:Cl_2$= 3:7 by using RIE device. Here, the surface of the flat region other than the region in which the convex area 18'a and 20a are yielded may be protected by forming a resist film (not shown), for example. The etching rate of Pt is about 13.8 nm/min and the etching rate of SBT is about 5.7 nm/min under the condition. Accordingly, the convex area 18'a and 20a can be removed effectively. As a result, the dielectric capacitor in which each of the both edges of the lower electrode layer 18'a and the dielectric film 19 form a flattened surface along with the surface of the upper electrode layer 20 as shown in FIG. SA is formed in the trenches 17a and 17b of the second interlevel insulator 17 respectively.

Further, in a case where Ir is used, instead of Pt, to form the lower electrode layer 18' and the upper electrode layer 20, the etching rate of Ir is about 4.9 nm/min and the etching rate of SBT is about 5.7 nm/min as mentioned earlier when applying RIE under the condition mentioned above. Accordingly, the convex areas 18'a and 20a can be removed in such a case. Further, the convex areas 18'a and 20a can be removed in a case where the lower electrode layer 18' is formed with Ti and Pt, and the upper electrode layer 20 is formed with Ir.

In the embodiment as described so far, the surface is completely made flattened by removing the convex areas 18'a and 20a through RIE, in a case where the surface is not flat because it has convex areas 18'a and 20a that were formed after the surface is flattened by removing the unnecessary areas of the lower electrode layer 18', the dielectric film 19 and the upper electrode layer 20 through CMP method. As a result, a short circuit will not occur between the lower electrode layer 18' and the upper electrode layer 20 or in between the lower electrode layers 18' formed adjacent to each other.

[Seventh Embodiment]

A seventh embodiment concerns with a manufacturing method of a dielectric capacitor in which an area formed in a trench of the dielectric film 19 made of such as SBT which is hard and fragile is not to be destroyed even in a case where a stress is concentrated in the trench of the interlevel insulator by pressure being applied from the top when CMP is performed, and the dielectric capacitor manufactured through the method.

Figure 14A:
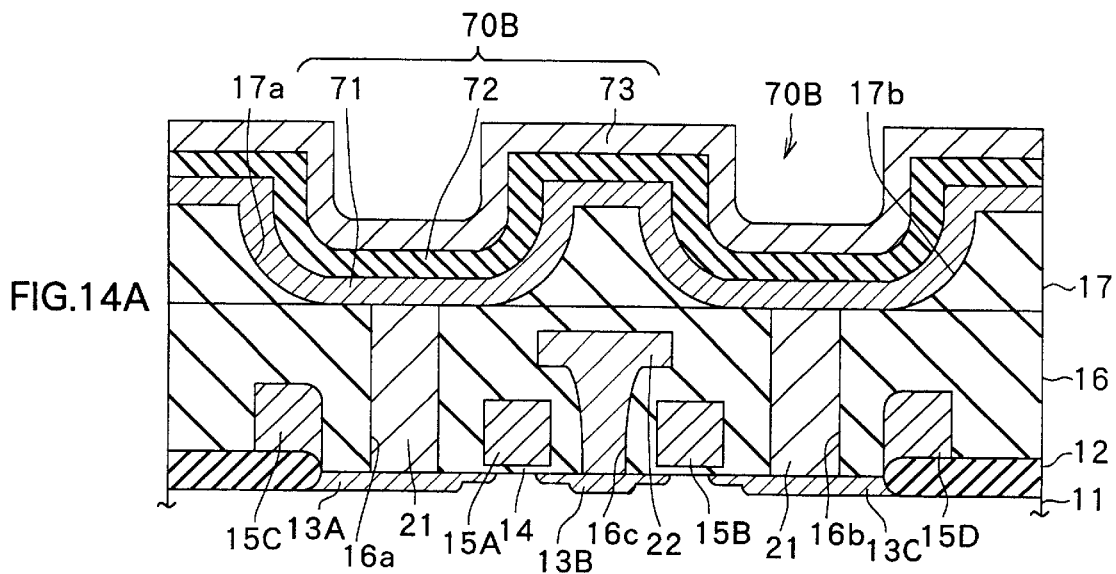
FIGS. 14A and 14B are cross sectional views for describing the manufacturing steps of the dielectric memory according to the seventh embodiment of the invention.
Figure 14B:
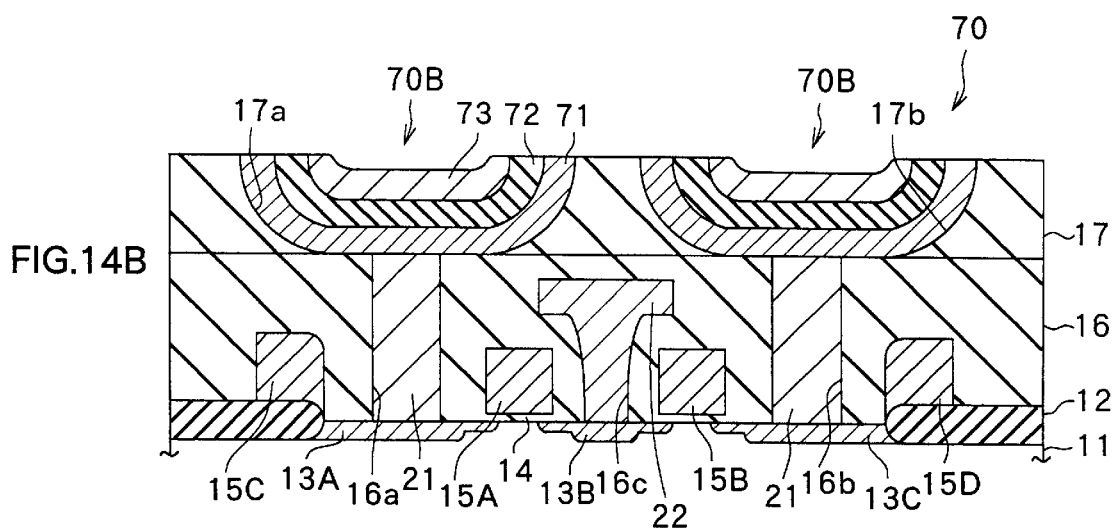

FIGS. 14A and 14B show a main manufacturing procedure of a dielectric memory 70 according to the embodiment. In the embodiment, after trenches 17a and 17b of 330 to 350 nm in depth, for example, are formed through the same procedure as the first embodiment shown in FIG. 4B, a lower electrode layer 71 of 100 nm in thickness made of such as Pt, a dielectric film 72 of 100 nm in thickness made of ferroelectric materials such as SBT and an upper electrode layer 73 of about 80 to 100 nm in thickness made of such as Pt are formed respectively by, for example, CVD method in order, as shown in FIG. 14A. Here, the height of the surface of the second interlevel insulator 17 is higher than the height of the surface of the upper electrode layer 73 in a range of 50 nm or less, for example, since the thickness of the upper electrode layer 73 is about 80 to 100 nm. An average diameter of particles of the polishing agent such as $Al_2O$ (alumina) used for CMP is, for example, about 50 nm or less and, in the embodiment, it is preferable to have the difference of the height mentioned above less than the average diameter of particles.

Next, as shown in FIG. 14B, the lower electrode layer 71, the dielectric film layer 72 and the upper electrode layer 73 except for the area of the trenches 17a and 17b are selectively removed with the second interlevel insulator 17 as an end point detection layer and, at the same time, the surface is flattened. Given that the electrode forming materials such as Pt has ductility as already described, for that, the dielectric capacitor 70B with the surface of the upper electrode layer 73 is slightly depressed than each of the both edges of the lower electrode layer 71 and the dielectric film 72, or the dielectric capacitor 70B with a flattened surface which consists of each edge of both the lower electrode layer 71 and the dielectric film 72 along with the surface of the upper electrode layer 73, is formed in the trenches 17a and 17b of the second interlevel insulator 17 respectively.

In the embodiment as described, the dielectric capacitor 70B which has a concave surface larger or about the average diameter of the particles of polishing materials such as $Al_2O_3$ used for CMP is performed is provided in the trenches 17a and 17b so that destroying the dielectric film 72 by the stress concentration as mentioned above can be effectively prevented.

The current invention has been described by referring to the embodiments so far, however, it is not limited to the foregoing embodiments and some other alternatives can be also considered. For example, the lower electrode layer, the dielectric film and the upper electrode layer of the dielectric capacitor are formed by CVD method in the foregoing embodiments, however, MOCVD (Metal Organic Chemical Vapor Deposition), or spattering method, for example, can be used as well.

Further, an example in which the lower electrode layer, the dielectric layer and the upper electrode layer forming the dielectric capacitor are collectively processed by CMP method has been described in the foregoing embodiment, other method such as mechanical polishing can be also used for the same purpose.

Further, in the sixth embodiment mentioned above, an example in which the convex areas 18' and 20a are removed by RIE is described, however, sputter etching can be used as well.

Further, in each of the foregoing embodiments, examples are described in which forming materials such as Pt and Ir are used for the lower electrode layer and the upper electrode layer. However, noble metal elements such as Pt, Ir, Ru, Rh or Pd or noble metal materials containing transition metal elements such as Hf (Hafnium), Zr (zirconium), or Ti and oxygen can be used as forming materials. Further, each electrode layer may have not only a single layer structure but a multi-layer structure made of these materials.

Further, in the seventh embodiment mentioned above, a method of manufacturing a dielectric capacitor with a shape of the first embodiment is described, however, it can be applied when dielectric capacitors of the second embodiment to the fifth embodiments are manufactured.

With the dielectric capacitor or the dielectric memory of the invention as described above, an effect of increasing accumulation capacitance is obtained by stacking the first electrode layer and the dielectric film along the bottom and side of the trenches since the dielectric capacitor and the dielectric memory of the invention have a structure in which a stacking structure formed with the first electrode layer, the dielectric film and the second electrode layer in the trench of the second interlevel insulator is buried.

Especially, with the dielectric capacitor of the invention, an effect of improving coating characteristic of the first electrode layer, the dielectric film and the second electrode layer can be obtained leading to the decrease in the characteristic fluctuation as well by providing a curvature area or an area with taper angle in the trench.

Further, with the dielectric capacitor of the invention, short circuit of the first electrode layers formed adjacent to each other can be prevented by providing a mutualdiffusion-preventing area in a neighboring area of the trench. Furthermore, with the dielectric capacitor of the invention, exfoliation of the first electrode layer can be prevented since a buffer layer is provided between the trench and the first electrode layer.

With the dielectric capacitor of the invention, electrically connected area can be made narrower than the minimum line width by forming a sidewall film in the electrically connected area of the wiring layer and the second electrode layer of the dielectric capacitor. Accordingly, in the connecting procedure of the second electrode layer and the wiring layer, short circuit of the first electrode layer and the second electrode layer can be prevented.

Further, with the method of manufacturing the dielectric capacitor of the invention, the surface of the trench is flattened according to the surface of the second interlevel insulator after stacking the first electrode layer, the dielectric film and the second electrode layer in this order in the trench of the second interlevel insulator so that etching can be easily performed even in a case where a stable material such as platinum is used as an electrode material.

Especially, with the method of manufacturing the dielectric capacitor of the invention, etching can be easily applied and manufacturing process can be simplified at the same time by collectively processing the first electrode layer, the dielectric film and the second electrode layer by chemical machine polishing.

Further, with a method of manufacturing the dielectric capacitor of the invention, the surface of the trench and the surface of the second interlevel insulator are completely flattened even in a case where unevenness occurs on the surface while chemical machine polishing is applied by flattening the surfaces of the trench and the second interlevel insulator by applying etching treatment on the surface after processing the first electrode layer, the dielectric film and the second electrode layer by chemical machine polishing. As a result, an insulating characteristic of the dielectric capacitor is improved and the dielectric capacitor with high reliability can be manufactured.

Further, in the methods of manufacturing a dielectric capacitor of the invention, the first electrode layer, the dielectric film and the second electrode layer area stacked with the height of the surface of the second interlevel insulator being higher than the height of the surface of the second electrode layer, then, the first electrode layer, the dielectric film and the second electrode layer are processed. As a result, destroying the areas formed in the trench can be effectively prevented even in a case where the stress is concentrated in the trench of the second interlevel insulator by pressure from the top being applied when performing chemical machine polishing.

What is claimed is:

1. A method of manufacturing a dielectric capacitor including steps of:

forming a second interlevel insulator with a surface being flattened on a substrate in which a transistor covered with a first interlevel insulator is formed, and forming a trench in the second interlevel insulator contacting the transistor;

flattening a surface of the trench in alignment with the surface of the second interlevel insulator after stacking a first electrode layer, a dielectric film, and a second electrode layer in the trench of the second interlevel insulator in this order.

2. A manufacturing method of a dielectric capacitor according to claim 1 wherein:

after forming the trench in the second interlevel insulator, the first electrode layer, the dielectric film and the second electrode layer are stacked in this order on the second interlevel insulator, and the first electrode layer, the dielectric film and the second electrode layer are processed by a chemical-mechanical polishing method with the second interlevel insulator as an end point detection layer, resulting in the surface of the trench being flattened in alignment with the surface of the second interlevel insulator.

3. A manufacturing method of a dielectric capacitor according to claim 2 wherein the first electrode layer, the dielectric film and the second electrode layer are processed by chemical-mechanical polishing, then, the polished surfaces are further flattened by applying an etching treatment to the surfaces of the trench and the second interlevel insulator.

4. A manufacturing method of a dielectric capacitor according to claim 2 wherein the first electrode layer, the dielectric film and the second electrode layer are stacked in this order with a height of the surface of the second interlevel insulator being higher than a height of the surface of the second electrode layer; then, the first electrode layer, the dielectric film and the second electrode layer are processed by chemical-mechanical polishing.

5. A manufacturing method of a dielectric capacitor according to claim 4 wherein the first electrode layer, the dielectric film and the second electrode layer are stacked in this order with the height of the surface of the second interlevel insulator being higher in a range of less than 50 nm than the height of the surface of the second electrode layer.

6. A manufacturing method of a dielectric capacitor according to claim 2 wherein the first electrode layer, the dielectric film an the second electrode layer are formed by chemical vapor deposition, respectively.

7. A manufacturing method of a dielectric capacitor according to claim 1 wherein the second interlevel insulator is selectively processed by isotropic etching so as to form the trench with a curved bottom and curved sides.

8. A manufacturing method of a dielectric capacitor according to claim 7 wherein the etching, which is to form the trench, is applied until the distance between the trench and a trench of the capacitor formed adjacently becomes the minimum line width or less.

9. A manufacturing method of a dielectric capacitor according to claim 1 wherein the second interlevel insulator is selectively processed by anisotropic etching so as to form the trench with a cross-section which takes the shape of a rectangle or a square.

10. A manufacturing method of a dielectric capacitor according to claim 9 wherein edges of the trench are smoothed by applying heat to the second interlevel insulator after forming the trench taking the shape of a rectangle or a square in the second interlevel insulator.

* * * * *